(12) United States Patent
Bhagavat et al.

(10) Patent No.: US 10,903,168 B2
(45) Date of Patent: Jan. 26, 2021

(54) MULTI-RDL STRUCTURE PACKAGES AND METHODS OF FABRICATING THE SAME

(71) Applicant: Advanced Micro Devices, Inc., Santa Clara, CA (US)

(72) Inventors: Milind S. Bhagavat, Broomfield, CO (US); Lei Fu, Austin, TX (US); Farshad Ghahghahi, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/887,184

(22) Filed: May 29, 2020

(65) Prior Publication Data

US 2020/0294923 A1    Sep. 17, 2020

Related U.S. Application Data

(62) Division of application No. 16/048,826, filed on Jul. 30, 2018, now Pat. No. 10,672,712.

(51) Int. Cl.
*H01L 23/538* (2006.01)
*H01L 25/16* (2006.01)
(Continued)

(52) U.S. Cl.
CPC ...... *H01L 23/5386* (2013.01); *H01L 21/4857* (2013.01); *H01L 21/563* (2013.01); *H01L 21/565* (2013.01); *H01L 21/568* (2013.01); *H01L 21/6835* (2013.01); *H01L 23/3128* (2013.01); *H01L 24/19* (2013.01); *H01L 24/24* (2013.01); *H01L 25/0655* (2013.01);
(Continued)

(58) Field of Classification Search
CPC . H01L 23/5386; H01L 21/4857; H01L 25/50; H01L 21/6835; H01L 24/19; H01L 25/0655; H01L 23/3128; H01L 24/24; H01L 21/563; H01L 21/565; H01L 25/16; H01L 21/568; H01L 2224/24137; H01L 2221/68345; H01L 2924/3511; H01L 2224/211; H01L 2221/6835; H01L 2924/19105
USPC .......................................................... 257/668
See application file for complete search history.

(56) References Cited

U.S. PATENT DOCUMENTS

| | | |
|---|---|---|
| 5,998,243 A | 12/1999 | Odashima et al. |
| 6,258,626 B1 | 7/2001 | Wang et al. |

(Continued)

FOREIGN PATENT DOCUMENTS

| | | |
|---|---|---|
| EP | 1909546 A1 | 4/2008 |
| WO | WO2006134914 A1 | 12/2006 |

OTHER PUBLICATIONS

Tom Krazit; *Intel shows off 80-core processor*; http://news.com. com/Intel+shows+off+80-core+processor/2100-1006_3; Feb. 11, 2007; pp. 1-3.

(Continued)

*Primary Examiner* — Caleen O Sullivan

(57) ABSTRACT

Various arrangements of multi-RDL structure devices are disclosed. In one aspect, an apparatus is provided that includes a first redistribution layer structure and a second redistribution layer structure mounted on the first redistribution layer structure. A first semiconductor chip is mounted on the second redistribution layer structure and electrically connected to both the second redistribution layer structure and the first redistribution layer structure.

20 Claims, 11 Drawing Sheets

(51) Int. Cl.
  *H01L 23/31* (2006.01)
  *H01L 25/065* (2006.01)
  *H01L 21/48* (2006.01)
  *H01L 21/56* (2006.01)
  *H01L 25/00* (2006.01)
  *H01L 21/683* (2006.01)
  *H01L 23/00* (2006.01)

(52) U.S. Cl.
  CPC .............. *H01L 25/16* (2013.01); *H01L 25/50* (2013.01); *H01L 2221/6835* (2013.01); *H01L 2221/68345* (2013.01); *H01L 2224/211* (2013.01); *H01L 2224/24137* (2013.01); *H01L 2924/19105* (2013.01); *H01L 2924/3511* (2013.01)

(56) References Cited

U.S. PATENT DOCUMENTS

| | | | |
|---|---|---|---|
| 6,339,254 B1 | 1/2002 | Venkateshwaran et al. |
| 6,468,833 B2 | 10/2002 | Uner et al. |
| 6,576,540 B2 | 6/2003 | Hsu et al. |
| 6,583,502 B2 | 6/2003 | Lee et al. |
| 6,593,662 B1 | 7/2003 | Pu et al. |
| 6,717,253 B2 | 4/2004 | Yang |
| 6,820,329 B2 | 11/2004 | Fang |
| 6,853,064 B2 | 2/2005 | Bolken et al. |
| 6,853,084 B2 | 2/2005 | Hsu et al. |
| 6,916,685 B2 | 7/2005 | Yang et al. |
| 7,041,591 B1 | 5/2006 | Lee et al. |
| 7,057,277 B2 | 6/2006 | Chen et al. |
| 7,081,402 B2 | 7/2006 | Hsu et al. |
| 7,109,576 B2 | 9/2006 | Bolken et al. |
| 7,198,980 B2 | 4/2007 | Jiang et al. |
| 7,396,753 B2 | 7/2008 | Chu et al. |
| 7,399,399 B2 | 7/2008 | Chou et al. |
| 7,485,970 B2 | 2/2009 | Hsu et al. |
| 7,528,474 B2 | 5/2009 | Lee |
| 7,545,048 B2 | 6/2009 | Meyer et al. |
| 7,554,203 B2 | 6/2009 | Zhou et al. |
| 7,799,608 B2 | 9/2010 | Chan et al. |
| 8,298,945 B2 | 10/2012 | Leung et al. |
| 8,946,900 B2 | 2/2015 | Qian et al. |
| 9,240,377 B2 | 1/2016 | Qian et al. |
| 2002/0006686 A1 | 1/2002 | Cloud et al. |
| 2002/0172026 A1 | 11/2002 | Chong et al. |
| 2003/0016133 A1 | 1/2003 | Egbert |
| 2003/0111733 A1 | 6/2003 | Pogge et al. |
| 2004/0106229 A1 | 6/2004 | Jiang et al. |
| 2009/0135574 A1 | 5/2009 | Tanaka et al. |
| 2011/0010932 A1 | 1/2011 | Tanaka et al. |
| 2012/0007211 A1 | 1/2012 | Aleksov et al. |
| 2012/0286419 A1 | 11/2012 | Kwon et al. |
| 2013/0049127 A1 | 2/2013 | Chen et al. |
| 2013/0168854 A1 | 7/2013 | Karikalan et al. |
| 2014/0102768 A1 | 4/2014 | Shizuno et al. |
| 2014/0264791 A1 | 9/2014 | Manusharow et al. |
| 2014/0332966 A1 | 11/2014 | Xiu et al. |
| 2015/0001717 A1 | 1/2015 | Karhade et al. |
| 2015/0001733 A1 | 1/2015 | Karhade et al. |
| 2015/0048515 A1 | 2/2015 | Zhang et al. |
| 2015/0092378 A1 | 4/2015 | Roy et al. |
| 2015/0171015 A1 | 6/2015 | Mahajan et al. |
| 2015/0228583 A1 | 8/2015 | Karhade et al. |
| 2015/0311182 A1 | 10/2015 | Lee et al. |
| 2015/0340459 A1 | 11/2015 | Lee |
| 2016/0085899 A1 | 3/2016 | Qian et al. |
| 2016/0181189 A1 | 6/2016 | Qian et al. |
| 2016/0293581 A1 | 10/2016 | Lin et al. |
| 2017/0133310 A1 | 5/2017 | Kelly et al. |
| 2017/0207204 A1 | 7/2017 | Lin et al. |

OTHER PUBLICATIONS

Ron Huemoeller et al.; *Silicon wafer integrated fan-out technology*; ChipScaleReview.com; Mar./Apr. 2015; pp. 1-4.

MULTI-RDL STRUCTURE PACKAGES AND METHODS OF FABRICATING THE SAME

This application is a divisional of Ser. No. 16/048,826, filed Jul. 30, 2018.

BACKGROUND OF THE INVENTION

A conventional type of multi-chip module includes two semiconductor chips mounted side-by-side on a carrier substrate or in some cases on an interposer (so-called "2.5D") that is, in-turn, mounted on a carrier substrate. The semiconductor chips are flip-chip mounted to the carrier substrate and interconnected thereto by respective pluralities of solder joints. The carrier substrate is provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion of the chips, the interposer and the solder joints.

One conventional variant of 2.5D interposer-based multi-chip modules uses a silicon interposer with multiple internal conductor traces for interconnects between two chips mounted side-by-side on the interposer. The interposer is manufactured with multitudes of through-silicon vias (TSVs) to provide pathways between the mounted chips and a package substrate upon which the interposer is mounted. The TSVs and traces are fabricated using large numbers of processing steps.

Another conventional multi-chip module technology is 2D wafer-level fan-out (or 2D WLFO). Conventional 2D WLFO technology is based on embedding die into a molded wafer, also called "wafer reconstitution." The molded wafer is processed through a standard wafer level processing flow to create the final integrated circuit assembly structure. The active surface of the dies are coplanar with the mold compound, allowing for the "fan-out" of conductive copper traces and solder ball pads into the molded area using conventional redistribution layer (RDL) processing. Conventional 3D WLFO extends the 2D technology into multi-chip stacking where a second package substrate is mounted on the 2D WLFO.

Some other conventional designs use embedded interconnect bridges (EMIB). These are typically silicon bridge chips (but occasionally organic chiplets with top side only input/outputs) that are embedded in the upper reaches of a package substrate.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
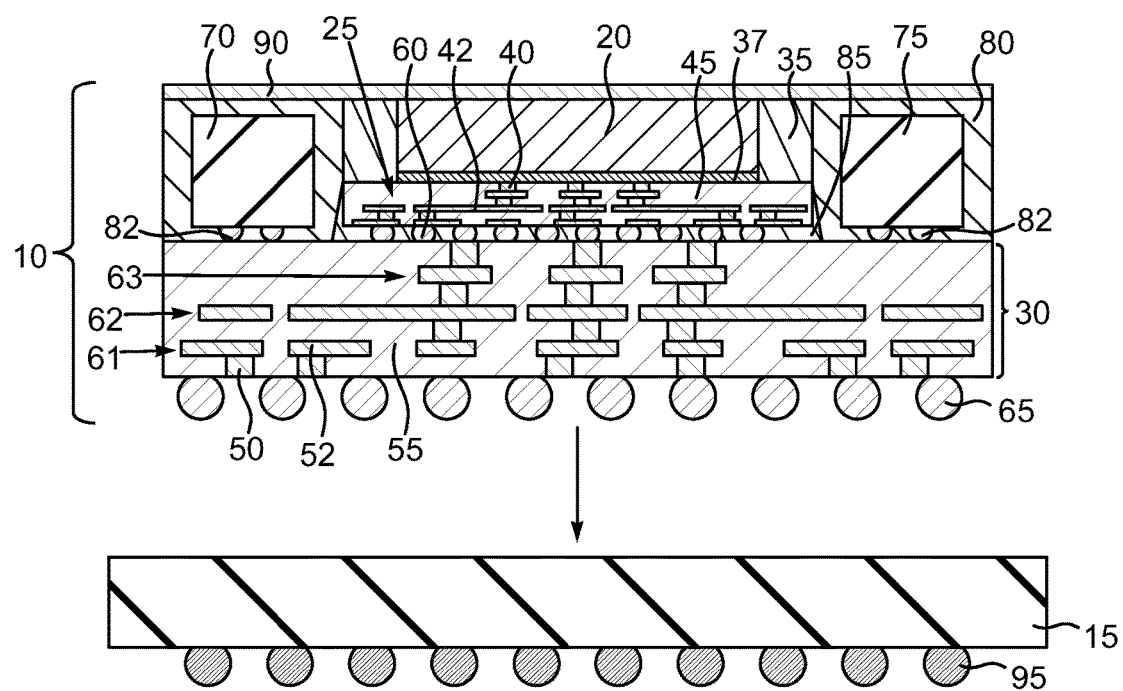
FIG. 1 is a sectional view of an exemplary arrangement of a semiconductor chip device.

Conventional organic build-up package substrates typically include a core and multiple build-up layers. The core, while useful to control warpage, can still present bottlenecks in terms of losses and package thickness. Thin packages are desirable for small form devices, such as hand-helds and laptops. In addition, normal laminate substrates do not enable very tight line/space rules on metal layers and are unable to support high bandwidth connections between 2.5D positioned dies. Many package designs call for multitudes of surface components, such as capacitors and inductors as well as thick metal ground and power planes. But doing so in a thin laminate package is very difficult.

Fan-out solutions can be created in thin forms. However, current fan-out solutions have a limit of three to four redistribution layers (RDL), and cannot include power/ground planes or surface components and thus must have a substrate to integrate with those features.

The disclosed arrangements utilize stacked RDL structures to create a fan-out on fan-out package that can have a total thickness of less than 1 mm, while providing for surface component mounting, thick metal for power/ground, and high density RDL proximate the die or chip. In addition, bumpless mounting can be used such that ESD protection is not necessary.

In accordance with one aspect of the present invention, an apparatus is provided that includes a first redistribution layer structure and a second redistribution layer structure mounted on the first redistribution layer structure. A first semiconductor chip is mounted on the second redistribution layer structure and electrically connected to both the second redistribution layer structure and the first redistribution layer structure.

In accordance with another aspect of the present invention, an apparatus is provided that includes a first redistribution layer structure that has plural conductor structures of a first design rule and a first plurality of I/Os to connect the first redistribution layer structure to another circuit board. A second redistribution layer structure is mounted on the first redistribution layer structure. The second redistribution layer structure has plural conductor structures of a second design rule with finer line width and spacing than the first design rule. A first semiconductor chip is mounted on the second redistribution layer structure and electrically connected to both the second redistribution layer structure and the first redistribution layer structure. Plural surface components are mounted on the first redistribution layer structure in spaced-apart relation to the first semiconductor chip.

In accordance with another aspect of the present invention, a method of manufacturing is provided that includes fabricating a first redistribution layer structure, fabricating a second redistribution layer structure and mounting the second redistribution layer structure on the first redistribution layer structure. A first semiconductor chip is on the second redistribution layer structure and electrically connected to both the second redistribution layer structure and the first redistribution layer structure.

In the drawings described below, reference numerals are generally repeated where identical elements appear in more than one figure. Turning now to the drawings, and in particular to FIG. 1, therein is shown a sectional view of an exemplary arrangement of a semiconductor chip device 10 that is shown exploded from a circuit board 15. In this illustrative arrangement, the semiconductor chip device 10 includes a semiconductor chip 20 that is mounted on a dual fan-out semiconductor chip package. The dual fan-out semiconductor chip package includes an RDL structure 25 upon which the semiconductor chip 20 is mounted and another RDL structure 30 upon which the RDL structure 25 is mounted. A molding material 35 is positioned on a peripheral surface of the RDL structure 25 and at least partially encases the semiconductor chip 20. The semiconductor chip 20 includes an interconnect structure 37, which can consist of plural layers of metallization and interlevel dielectric layers that are designed to be ohmically connected with various conductor structures of the RDL structure 25. The semiconductor chip 20, and in particular the substrate portion thereof, can be constructed of silicon, germanium, or other types of semiconductor materials. The semiconductor chip 20, and any others disclosed herein, can be any of a variety of integrated circuits. A non-exhaustive list of examples includes microprocessors, graphics processing units, application processing units that combines aspects of both, memory devices, an application integrated specific circuit or other. The semiconductor chip 20 is constructed with a physical device or "PHY" region, which has various internal and external conductor structures dedicated to the transmission of chip-to-chip signals, and a non-PHY region, which has conductor structures that are tailored more to the conveyance of power and ground and/or chip-to-circuit board signals.

The RDL structure 25 consists of plural conductor layers that include vias 40, traces 42 and others, such as pads and other types of conductor structures suitable for RDL fabrication, and plural interlevel dielectric layers 45. The vias 40, traces 42 and others can be constructed of copper, aluminum, gold, platinum, palladium, combinations of such or other conductors, and be fabricated using well-known material deposition techniques, such as, plating, sputtering, chemical vapor deposition, combinations of these or the like and patterned as necessary using well-known photolithography and directional etching techniques. Significantly, the vias 40 and traces 42 and others are fabricated with fine line widths and spacings, on the order of 2.0 µm or less. Fine line spacing and more than two levels of conductors can provide high density pathways in a bumpless process. The interlevel dielectric layers 45 are preferably constructed of polymeric materials, such as polyimide, benzocyclobutene or the like with or without photoactive compounds that facilitate photolithographic patterning of openings therein. Well-known spin coating and baking techniques can be used to apply the interlevel dielectric layers 45. The RDL structure 30 similarly consists of plural conductor vias 50, traces 52 (and others not shown) and plural interlevel dielectric layers 55. The RDL structure 30 includes multiple metallization layers 61, 62 and 63 made up of the vias 50, traces 52 (and others not shown). The RDL structure 30 is intended to predominantly convey power and ground and accordingly requires thicker dielectrics than are readily manufacturable using spin coating. Thus, in this exemplary arrangement, the plural interlevel dielectric layers 55 are preferably fabricated by compression molding a molding material. Additional details of the molding processes will be described in more detail below. The RDL structure 25 is fabricated with some design rule or set of design rules that are proportionally smaller than the design rules utilized for the RDL structure 30. While a variety of design rules can be used, and minimum geometries will likely shrink in future technologies, in one arrangement, a 2 µm rule can be used for the RDL structure 25 and a 5 to 10 µm rule can be used for the RDL structure 30.

Both the RDL structures 25 and 30 function as fan out structures and accordingly are provided with respective sets of I/Os 60 and 65. The I/Os 60 interconnect the RDL structure 25 with various conductor structures of the RDL structure 30 and the I/Os 65 electrically connect the RDL structure 30 to some other structure, such as the circuit board 15 shown in FIG. 1. The I/O structures 60 and 65 can be solder bumps, solder micro bumps, copper pillars or other types of I/O structures. If composed of solder, the I/Os 60 and 65 (and other I/Os disclosed herein) can be composed of various well-known solder compositions, such as tin-silver, tin-silver-copper or others.

The semiconductor chip 20 and the RDL structure 25 have a footprint that is smaller than the footprint of the RDL structure 30, which leaves room for the placement of discrete components, such as the components 70 and 75 that are mounted in spaced-apart relation relative to the semiconductor chip 20. The number of components 70 and 75 can be greater than two. Examples include capacitors, inductors, resistors, or other types of component devices. The component devices 70 and 75 can be encased with a molding material 80 to facilitate mechanical strength and heat transfer. The components 70 and 75 can be electrically connected to the RDL structure 30 by way of I/Os 82, which can be solder bumps, micro bumps, copper pillars or others. An underfill 85 is disposed between the RDL structure 25 and the RDL structure 30 to lessen the effects of differential CTE between the RDL structure 30 and both the RDL structure 25 and the chip 20. Well-known underfill materials, such as Namics or others, and capillary dispensing and baking techniques can be used to position the underfill 85. Note that the molding material 80 surrounds laterally the combination of the chip 20, the molding material 35, the RDL structure 25 and the underfill 85.

An optional stiffener sheet 90 can be positioned on the chip 20 and the upper surface of the molding material 80 to resist package warpage. The stiffener sheet 90 can be composed of silicon, another type of semiconductor, a glass material or various metals, such as nickel.

The circuit board 15 can be organic or ceramic and single, or more commonly, multilayer. Examples include package substrates, circuit boards, circuit cards or even another semiconductor device, such as an interposer or chip. The circuit board 15 can include plural I/Os 95, which can be solder bumps, balls or other and composed of the materials disclosed elsewhere herein.

Figure 2:
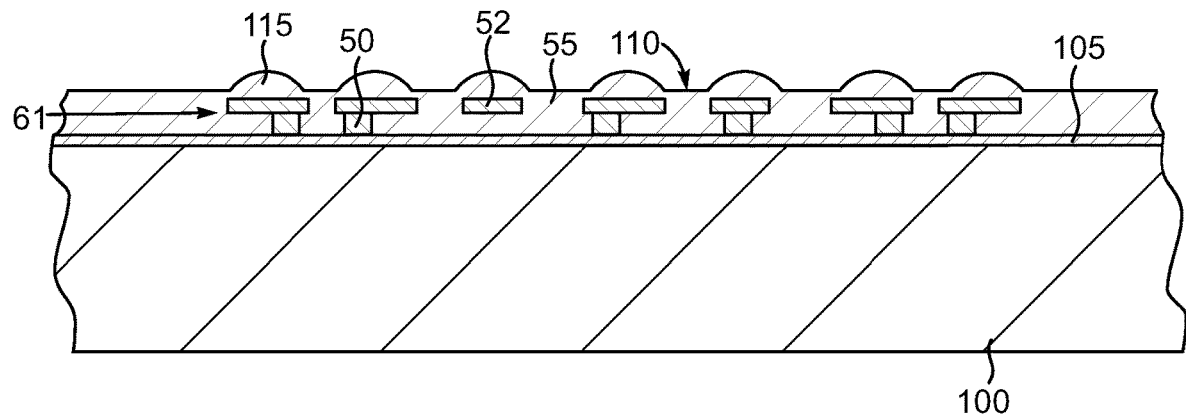
FIG. 2 is a sectional view depicting exemplary initial redistribution layer (RDL) structure fabrication.
Figure 3:
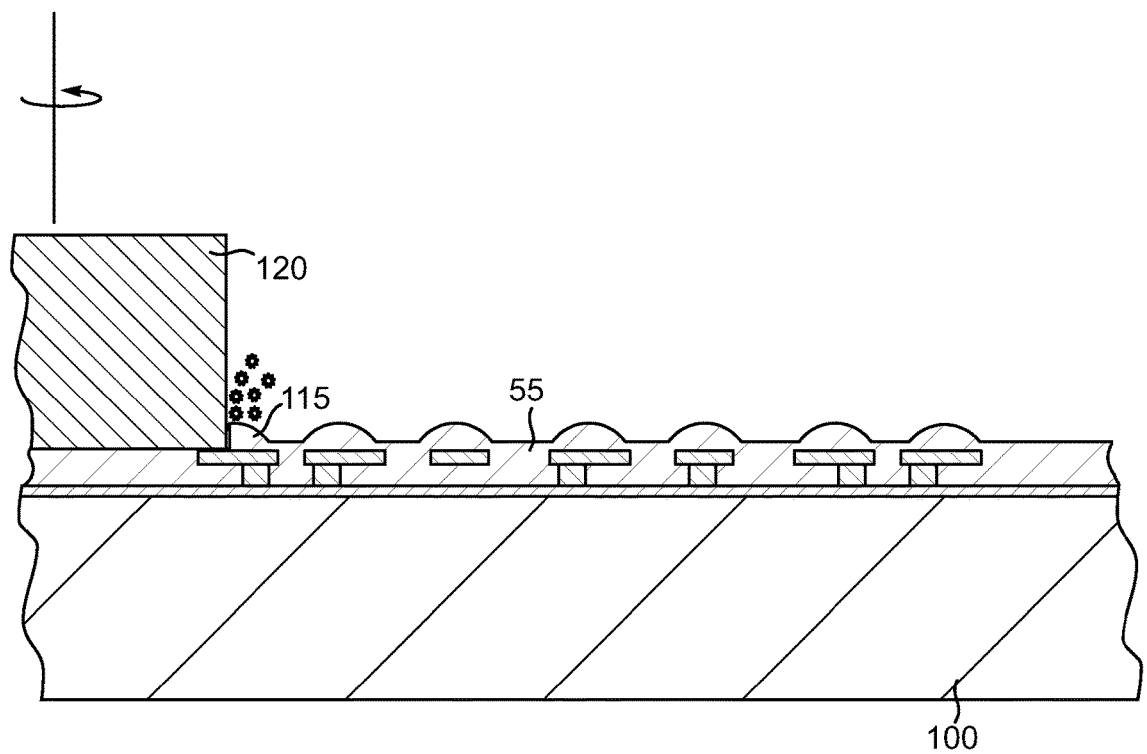
FIG. 3 is a sectional view like FIG. 2, but depicting exemplary RDL dielectric layer planarization.
Figure 4:
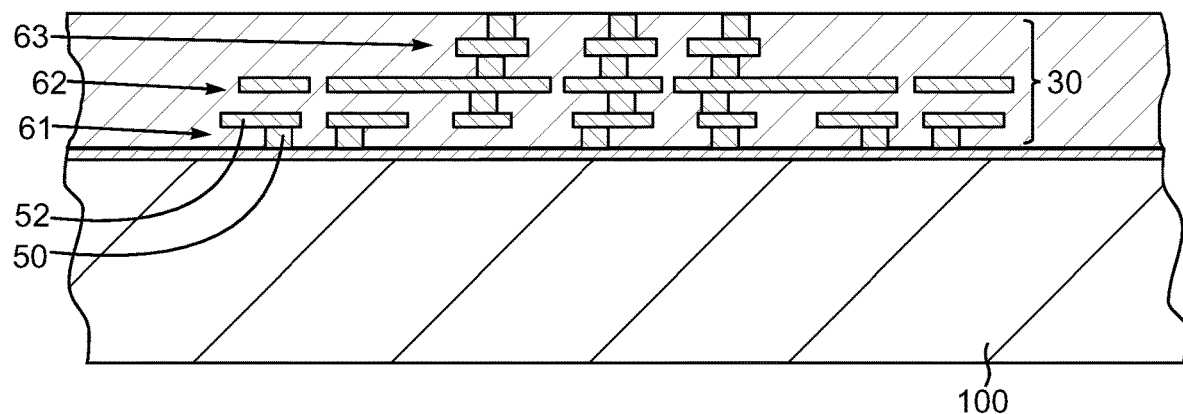
FIG. 4 is a sectional view like FIG. 3, but depicting exemplary additional RDL structure metallization and dielectric layer fabrication.

Exemplary methods for fabricating the semiconductor chip device 10 will be understood by referring now to FIGS. 2, 3, 4, 5, 6, 7, 8, 9, 10, 11, 12, 13, 14, 15, 16, 17, 18, 19, 20 and 21 and initially to FIGS. 2, 3 and 4. Attention is turned first to an exemplary technique for fabricating the RDL structure 30. This exemplary technique utilizes plating to manufacture the conductor vias 50 and traces 52. As shown in FIG. 2, initially, a carrier wafer 100 is coated with a plating seed layer 105. The carrier wafer 100 is composed of silicon, various glasses or other materials. The seed layer 105 could be electroless plated or glued on in sheet form. Next, a suitable resist mask (not shown) is applied, exposed and developed using well-known techniques and the vias 50 are plated on the seed layer 105 using a biased plating process. That first resist mask is stripped, and another resist mask (not shown) is applied, exposed and developed using well-known techniques and the traces 52 are plated on the vias 50 using a biased plating process to establish the first metallization layer 61. The vias 50 are formed first, but, optionally, the traces 52 could be patterned first. That second mask (not shown) is then stripped and a compression molding process is performed to apply the first interlevel dielectric 55. The RDL structure 30 depicted in FIG. 1 preferably consists of multiple layers of conductor traces 52 and inter level dielectrics and vias 50. Due to the presence of the underlying vias 50 and traces 52 of the first metallization layer 61, the upper surface 110 of the interlevel dielectric layer 55 is not planar, but instead includes multiple mounds or raised areas 115 that overlie the underlying conductor traces 52. These raised areas 115 can be tolerated if the number of individual interlevel dielectric layers 55 is kept below three. However, if it is desired to increase the number of individual metallization layers for the RDL structure 30 then an optional planarization step can be performed as shown in FIG. 3 where the dielectric layer 55 and in particular the raised areas 115 can be removed by a grinding pad or wheel 120 or other machine tool with the carrier wafer 100 providing mechanical support. Following the optional planarization as shown in FIG. 3, the foregoing processes are repeated to create the metallization layers 62 and 63 and the vias 50 and traces 52 thereof, as well as the additional molded interlevel dielectric layers 55. This yields the completed RDL structure 30, albeit in an unsingulated form on the carrier wafer 100. Since the processing can be at wafer level, there can be multitudes of RDL structures 30 on the carrier wafer 100 awaiting further processing and eventual singulation. The RDL structure 30 is fabricated with three metallization layers 61, 62 and 63 in this illustrative arrangement, but other numbers are possible.

Figure 5:
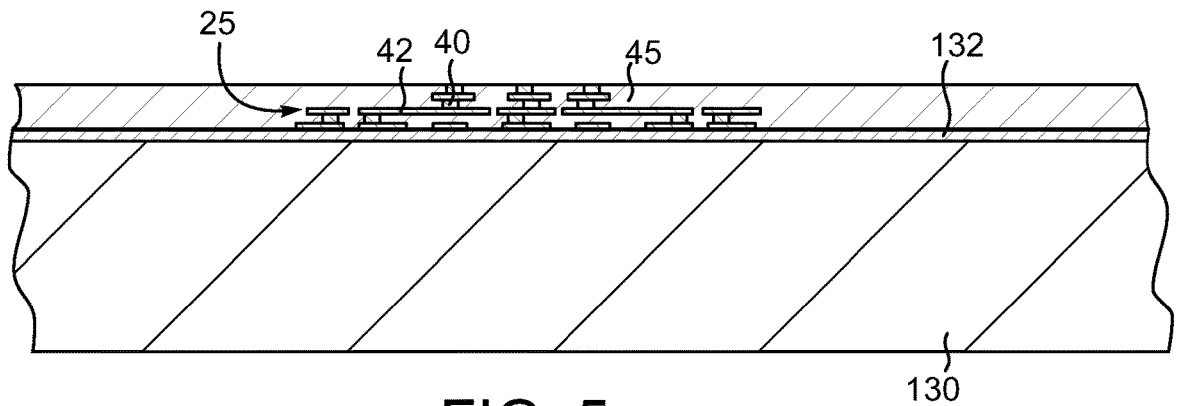
FIG. 5 is a sectional view depicting exemplary initial redistribution layer (RDL) structure fabrication for a higher density circuit RDL structure.

The fabrication of the RDL structure 25 and the mounting of the chip 20 depicted in FIG. 1 thereon will now be described in conjunction with FIGS. 5, 6, 7, 8 and 9. This first arrangement to be described utilizes a chip or die last approach wherein the RDL structure 25 is fabricated first and the chip 20 is mounted thereon thereafter. However, as described in conjunction with other figures below, a die first approach can alternatively be used. As shown in FIG. 5, the RDL structure 25 is fabricated on another carrier wafer 130. The RDL structure 25, shown in unsingulated form in FIG. 5, can be fabricated using the same general techniques just described to fabricate the RDL structure 30 in terms of using a plating seed layer 132 and plating vias 40 and traces 42. However, polymer layer spin coating and baking are used to establish the interlevel dielectric layers 45. And since the interlevel dielectric layers 45 can be infused with photoactive compounds, via holes can be patterned so that fabrication of the vias 42 can succeed application of a given interlevel dielectric layer 45. The RDL structure 25 is fabricated with three metallization layers in this illustrative arrangement, but other numbers are possible. In addition, as noted above, since the RDL structure 25 has much finer scale conductor structures than the RDL structure 30, smaller design rules will be used to fabricate the various traces 40 and vias 42 and the multiple inter level dielectric layers 45.

Figure 6:
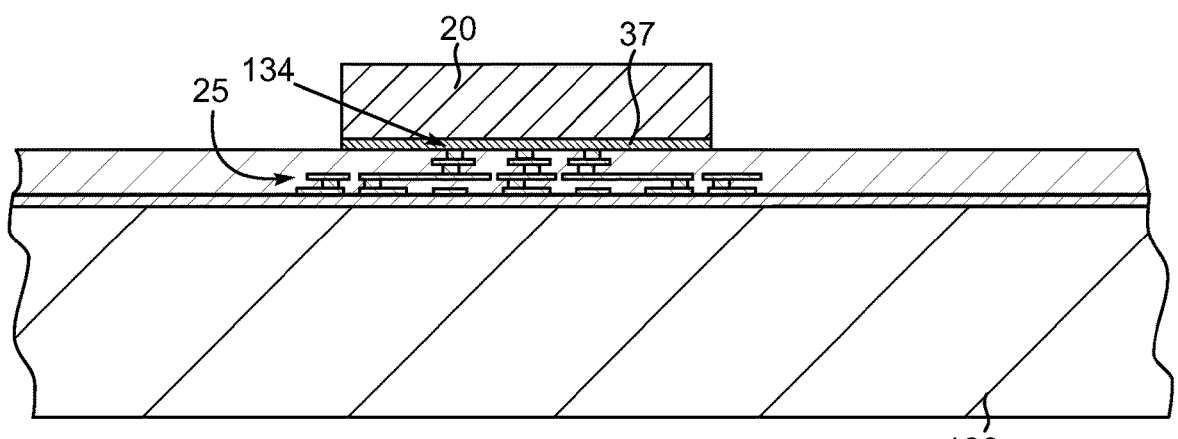
FIG. 6 is a sectional view like FIG. 5, but depicting exemplary semiconductor chip mounting.
Figure 7:
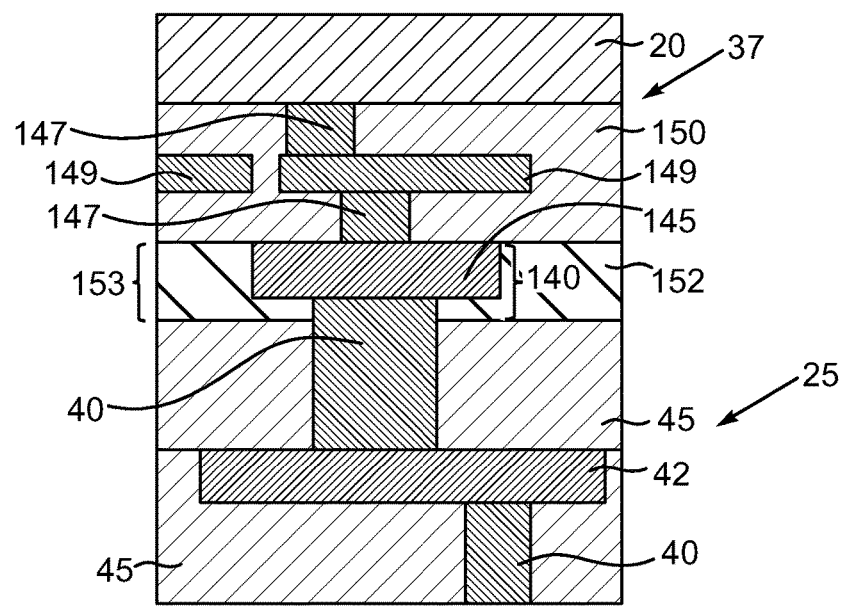
FIG. 7 is a blow up sectional view of an exemplary chip-to-RDL structure interconnect.

Next and as shown in FIG. 6, the semiconductor chip 20 is mounted on the RDL structure 25 with the interconnect structure 37 thereof facing down. The interconnect structure 37 of the semiconductor chip 20 can be electrically connected to the RDL structure 25 in a variety of ways. One example of these chip-to-RDL connections at location 134 in FIG. 6 is shown at greater magnification in FIG. 7, labeled 140 and will be illustrative of the other connections between the semiconductor chip 20 and the RDL structure 25. The RDL structure 25 includes multiple interlevel dielectric layers 45 and layers of conductor structures (vias 40 and traces 42, etc.). Vias 40 and a trace 42 are depicted, but of course there can be many more such structures. The interconnect structure 37 of the semiconductor chip 20 similarly includes plural metallization and interlevel dielectric layers. A bond pad 145, vias 147 and traces 149 are depicted, but of course there can be many more such structures. The bond pad 145, the vias 147 and the traces 149 can be constructed using the same materials and techniques described in conjunction with the RDL structure 25 conductors. The interlevel dielectric layers, collectively labeled 150, can be composed of SiOx or other suitable chip interlevel dielectric layers. The connection 140 in this arrangement is a thermal compression bonding between the via 40 and the bond pad 145. Other possibilities include solder bumps, conductive pillars with or without solder caps or others. One or more polymer films 152, such as polyimide, benzocyclobutene, various well-known underfills or others, are filled or otherwise placed into the gap 153 between the interconnect structure 37 and the RDL structure 25. The carrier wafer 130 remains as a supportive structure for these processes.

Figure 8:
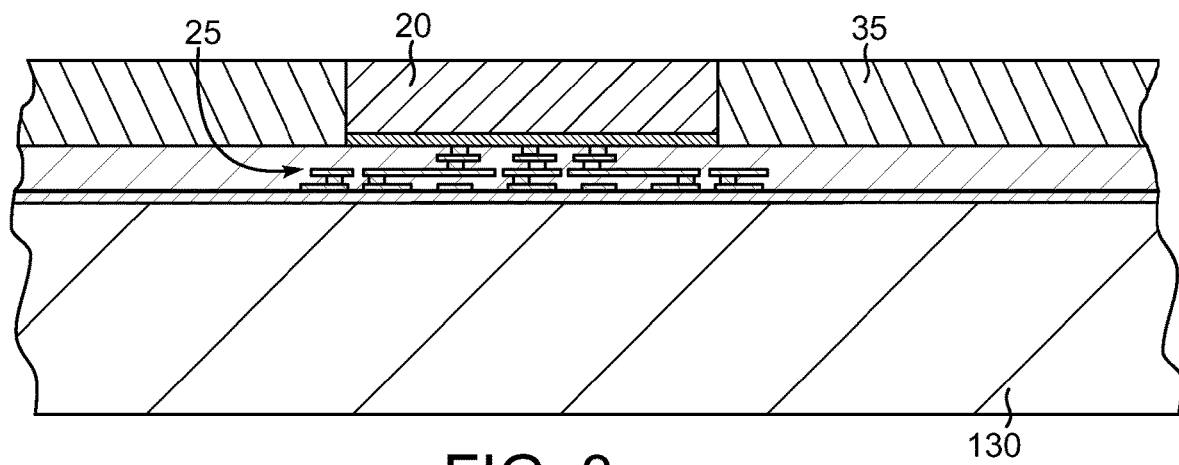
FIG. 8 is a sectional view like FIG. 6, but depicting exemplary molding of a molding material.

Next and as shown in FIG. 8, the molding material 35 is compression molded on the RDL structure 25. The molding material 35 at least laterally encases the semiconductor chip 20 and, if desired, can actually cover the top of the semiconductor chip 20. Well-known molding compounds can be used, such as Sumitomo EME-G750 or G760 or the other molding materials disclosed herein, to mold at about 165° C. for about 60 to 120 minutes. The carrier wafer 130 remains as a supportive structure for these processes.

Figure 9:
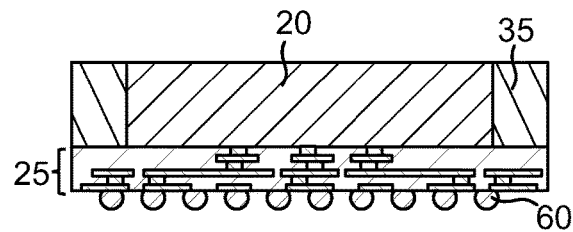
FIG. 9 is a sectional view depicting an exemplary semiconductor chip mounted on a singulated RDL structure.
Figure 10:
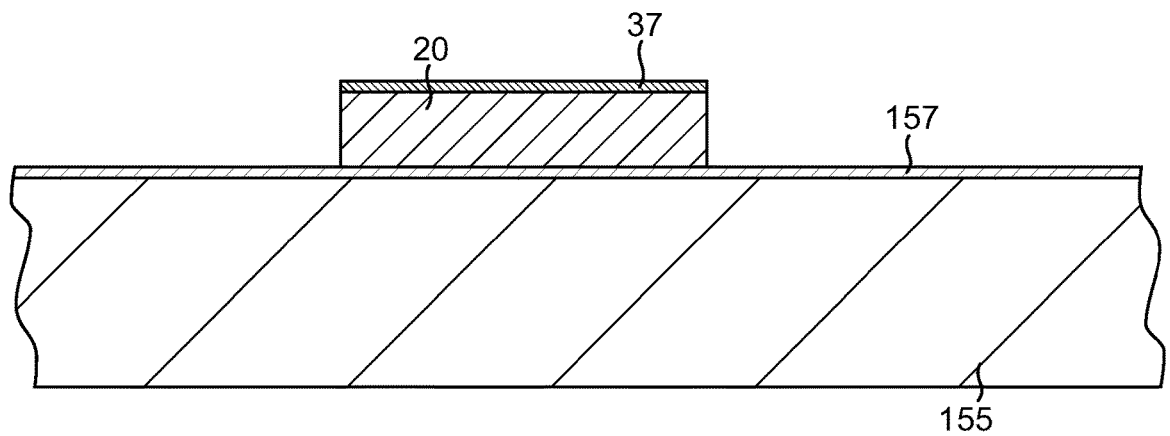
FIG. 10 is sectional view depicting exemplary chip mounting on a carrier wafer.

Next and as shown in FIG. 9, following the molding operation shown in FIG. 8, the carrier wafer 130 is removed by grinding or adhesive release techniques. The grinding operation also removes the seed layer 132 and exposes the lowermost metallization of the RDL structure 25. After removal of the carrier wafer 130, the RDL structure 25 makes up part of a reconstituted wafer. Indeed, there can be multitudes of RDL structures 25 and corresponding chips 20 thereon. At this point, the I/Os 60 can be placed on the RDL structure 25 and the combination of the chip 20, the RDL structure 25 and the molding 35 can be singulated. Optionally, the I/Os 60 could be placed after singulation. In either event, placement of the I/Os 60 can entail solder pick and place, solder stenciling, solder plating or other types of I/O connection/fabrication techniques. The combination of the chip 20 and the RDL structure 25 is now ready to be mounted on the RDL structure 30 as shown in FIG. 10.

Figure 11:
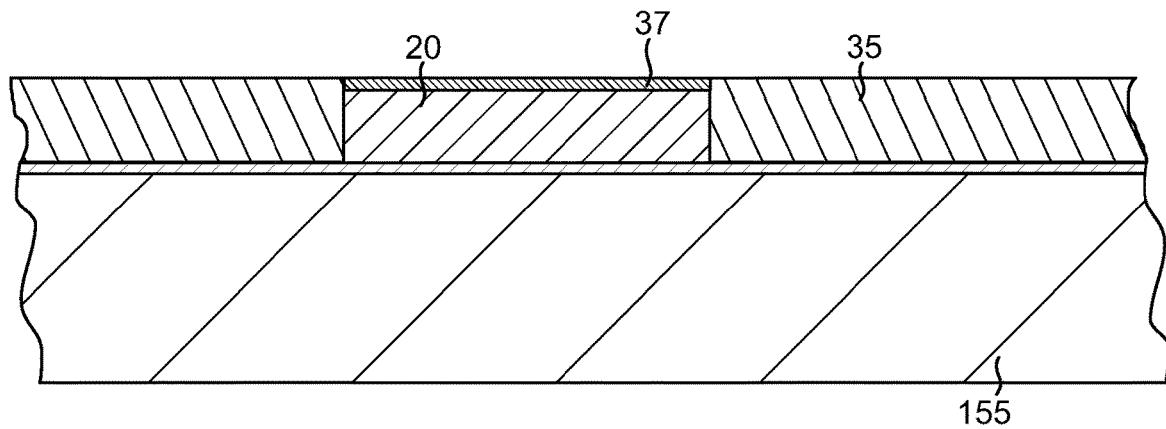
FIG. 11 is a sectional view like FIG. 10, but depicting exemplary molding of a molding material.

In the process just described in conjunction with FIGS. 5-8, a chip last process is used. However, a chip first process can be alternatively used to produce a combination of the chip 20 and the RDL structure 25 like that depicted in FIG. 9. This alternative process can be understood by referring now to FIGS. 10-12. Initially and as shown in FIG. 10, the semiconductor chip 20 is mounted on a carrier wafer 155 with the interconnect structure 37 facing upwards. The semiconductor chip 20 secured to the carrier wafer 155 by a suitable reversible adhesive 157, such as a light-activated or heat-activated adhesive. Next, and as shown in FIG. 11, the molding material 35 is molded around and possibly over the semiconductor chip 20. This can be done with multiple copies of the semiconductor chip 20 at a time to create a reconstituted wafer. If the molding material 35 covers the interconnect structure 37, then a grinding operation can be performed to reveal the interconnect structure 37. The carrier wafer 155 remains as a supportive structure for these processes.

Figure 12:
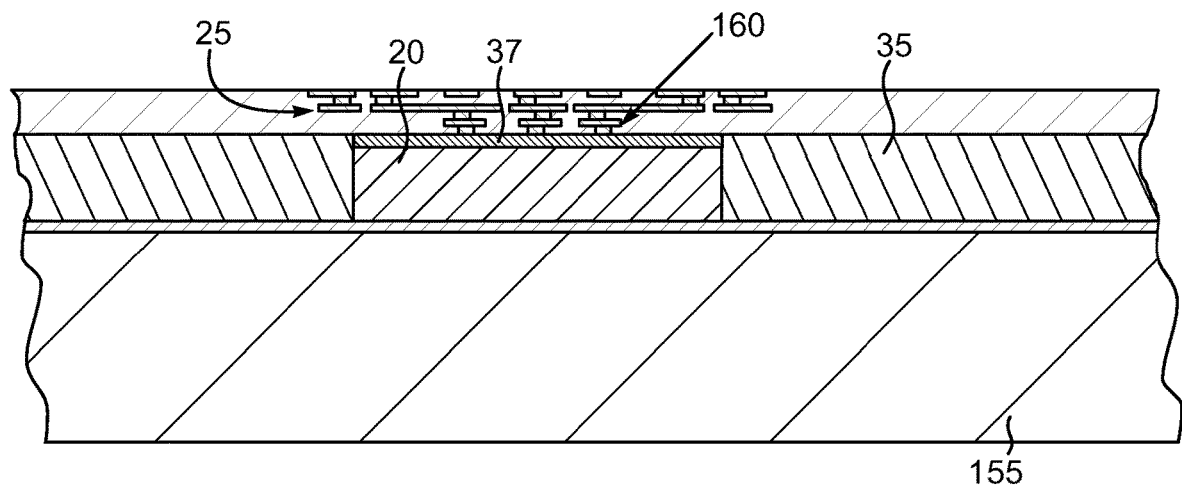
FIG. 12 is a sectional view like FIG. 11, but depicting exemplary high density RDL structure fabrication on a semiconductor chip.
Figure 13:
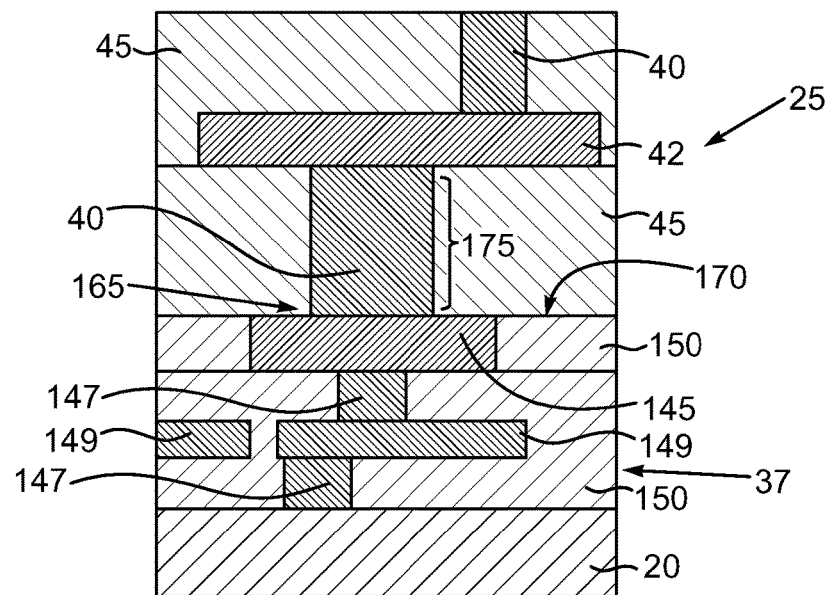
FIG. 13 is a blow up sectional view of an exemplary RDL structure-to-chip interconnect.

Next, and shown in FIG. 12, the RDL structure 25 is built up on the semiconductor chip 20 and the molding material 35 with electrical connections between the RDL structure 25 and the interconnect structure 37 of the semiconductor chip 20. The process to fabricate the RDL structure 25 can be substantially as described in conjunction with FIGS. 5-7 with a few differences that deal principally with the electrical connections between the RDL structure 25 and the interconnect structure 37. One example of these chip-to-RDL connections at location 160 in FIG. 12 is shown at greater magnification in FIG. 13, labeled 165 and will be illustrative of the other connections between the semiconductor chip 20 and the RDL structure 25. The RDL structure 25 includes multiple interlevel dielectric layers 45 and layers of conductor structures (vias 40 and traces 42, etc.). Vias 40 and a traces 42 are depicted, but of course there can be many more such structures. The interconnect structure 37 of the semiconductor chip 20 similarly includes plural metallization and interlevel dielectric layers. The bond pad 145, the vias 147 and the traces 149 are depicted, but of course there can be many more such structures. The bond pad 145, the vias 147 and the traces 149 can be constructed using the same materials and techniques described in conjunction with the RDL structure 25 conductors. The interlevel dielectric layers are collectively labeled 150 and are composed of SiOx or other suitable chip interlevel dielectric layers. The connection 165 in this arrangement is establishing by planarizing the surface 170 of the topmost interlevel dielectric layer 150 by chemical mechanical polishing or otherwise to expose the bond pad 145. Next, the first interlevel dielectric layer 45 of the RDL structure 25 is applied and patterned using the techniques and materials described elsewhere herein to yield an opening 175 over the bond pad 145. Next a plating or other process is used to form the via 40 in the opening in contact with the bond pad 145. The process of interlevel dielectric layer 45 and metal patterning is continued to yield the RDL structure 25.

At this point, the I/Os 60 shown in FIGS. 1 and 9 can be placed on the RDL structure 25 and the combination of the chip 20, the RDL structure 25 and the molding 35 can be singulated. Placement of the I/Os 60 can entail solder pick and place, solder stenciling, solder plating or other types of I/O connection/fabrication techniques. The combination of the chip 20 and the RDL structure 25 is like what is shown in FIG. 9. Next, the carrier wafer 155 depicted in FIG. 12 is removed by adhesive reversal or even grinding. After removal of the carrier wafer 155, the RDL structure 25 makes up part of a reconstituted wafer. Indeed, there can be multitudes of RDL structures 25 and corresponding chips 20 thereon.

Note that, whether chip first or chip last is used, the fabrication of the RDL structure 30 can precede the fabrication of the RDL structure 25 and the mounting of the chip 20 thereon, can proceed in parallel with fabrication of the RDL structure 25 or can succeed those operations if desired. In any event, the chip 20 and RDL structure 25 are mounted to the RDL structure 30 by way of the I/Os 60 and a suitable reflow process is performed to establish the requisite metallurgical connections. Note that the RDL structure 30 is still essentially a reconstituted RDL wafer that is seated on the carrier wafer 100.

Figure 14:
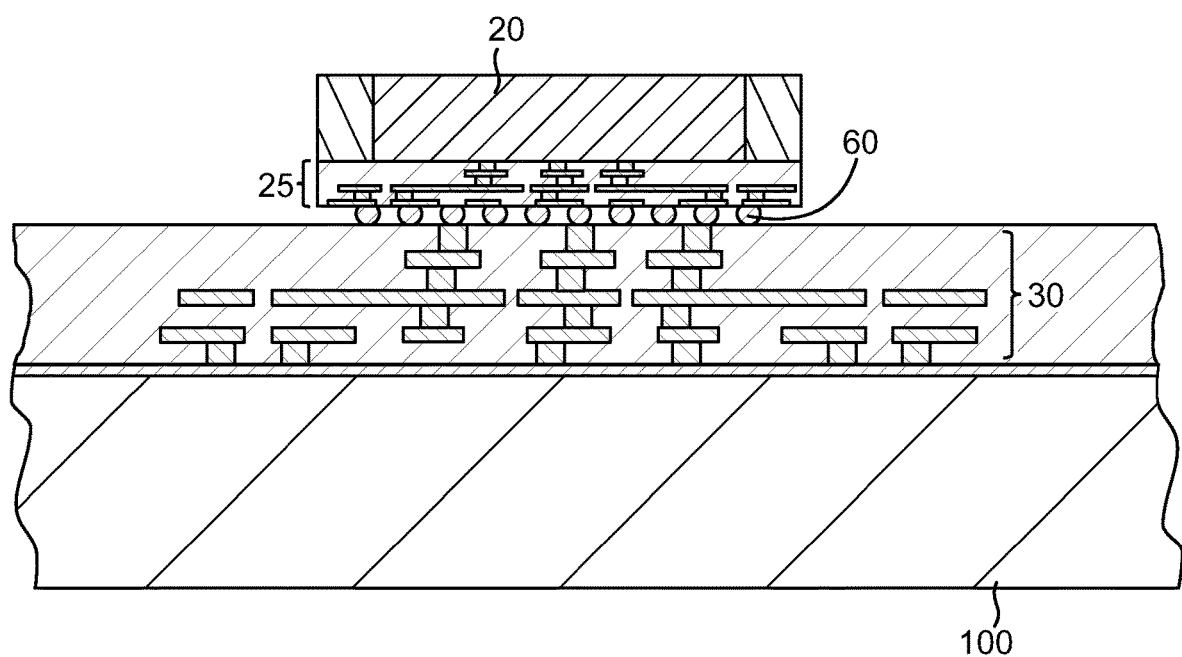
FIG. 14 is a sectional view like FIG. 4, but depicting mounting the exemplary semiconductor chip and RDL structure on another RDL structure.

Whether chip first or chip last fabrication is used, the singulated combination of the chip 20 and the RDL structure 25 shown in FIG. 9 is mounted on the RDL structure 30 as shown in FIG. 14. A reflow or other suitable process is performed to bond the I/Os 60 to the RDL structure 30. The carrier wafer 100 remains as a supportive structure for these processes.

Figure 15:
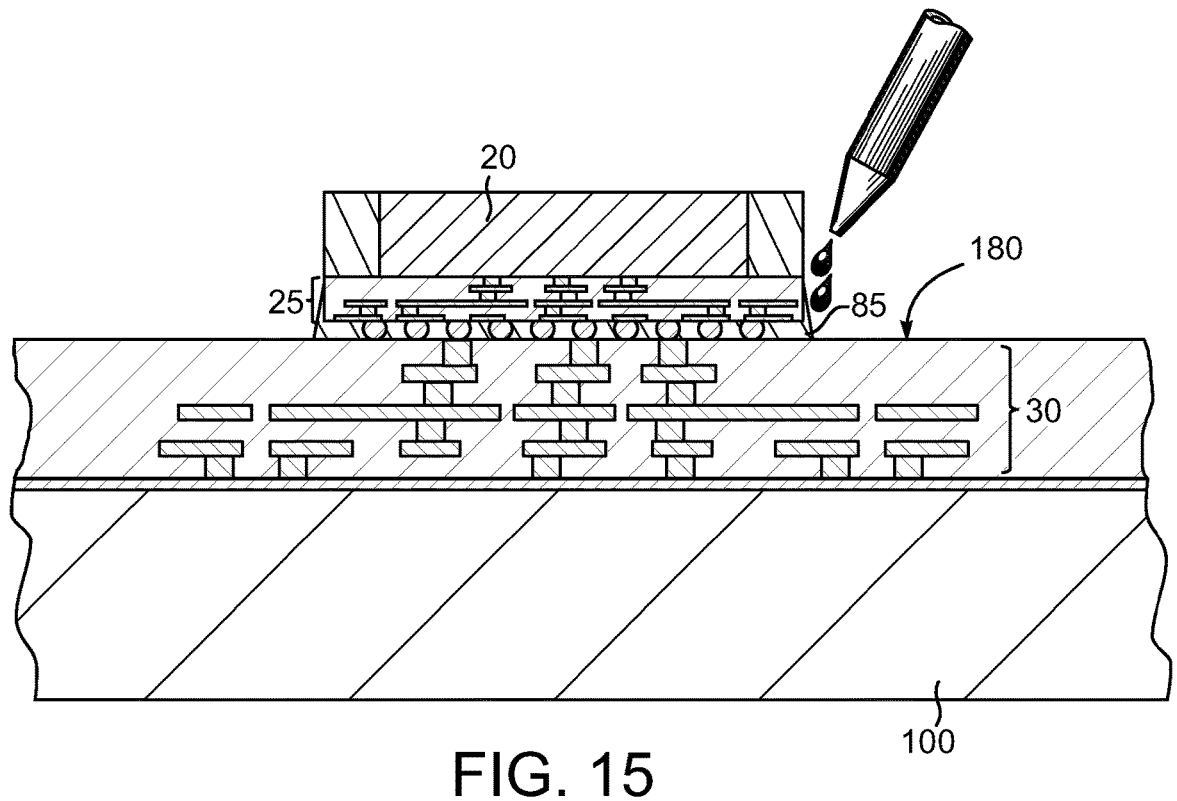
FIG. 15 is a sectional view like FIG. 14, but depicting exemplary underfill application.

Next and as shown in FIG. 15, the underfill 85 is established between the RDL structure 25 and the upper surface 180 of the RDL structure 30. Again this can entail a capillary application followed by a suitable bake process. It might be possible to use an alternate underfill application where the underfill 85 is positioned first and thereafter the chip 20 and the RDL structure 25 are mounted down on the RDL structure 30. Again, the carrier wafer 100 is still in place at this point.

Figure 16:
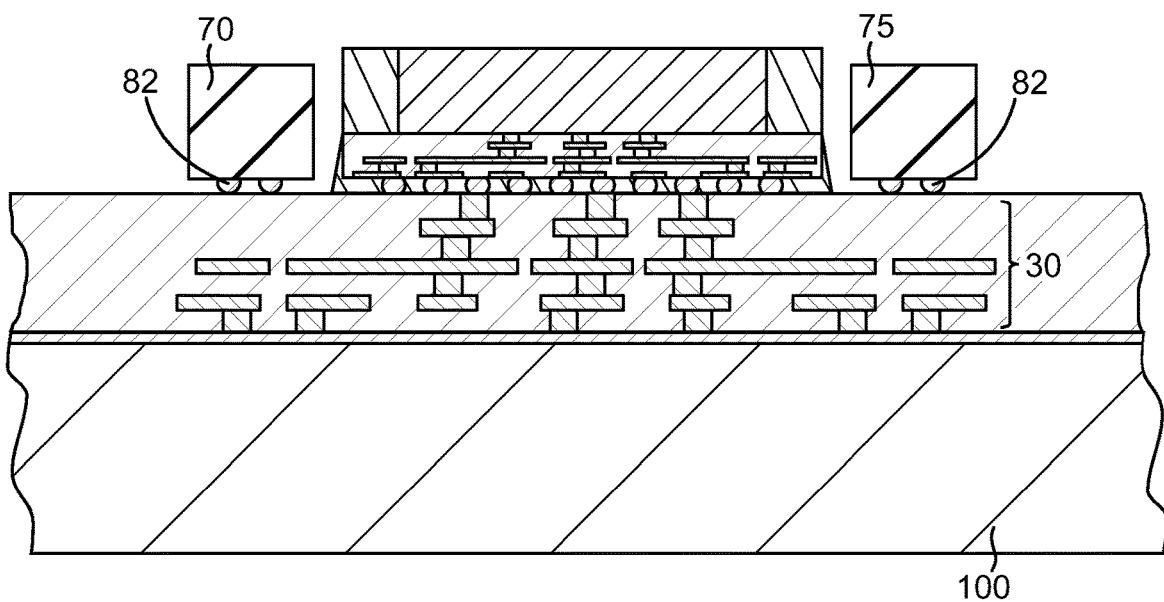
FIG. 16 is a sectional view like FIG. 15, but depicting exemplary surface component mounting.

Next and as shown in FIG. 16, the surface components 70 and 75 can be mounted on and electrically connected to the RDL structure 30 by way of the I/Os 82 and a suitable reflow performed as necessary to establish the requisite metallurgical connections. Again, the carrier wafer 100 is still in place at this point.

Figure 17:
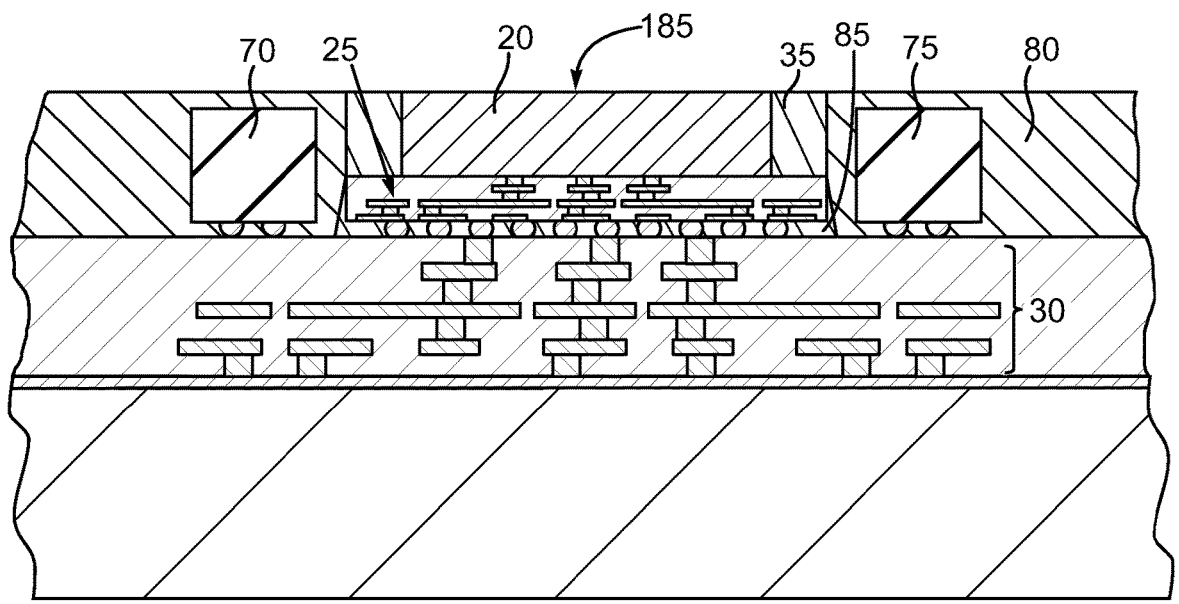
FIG. 17 is a sectional view like FIG. 16, but depicting exemplary molding of a molder material around the surface components.
Figure 18:
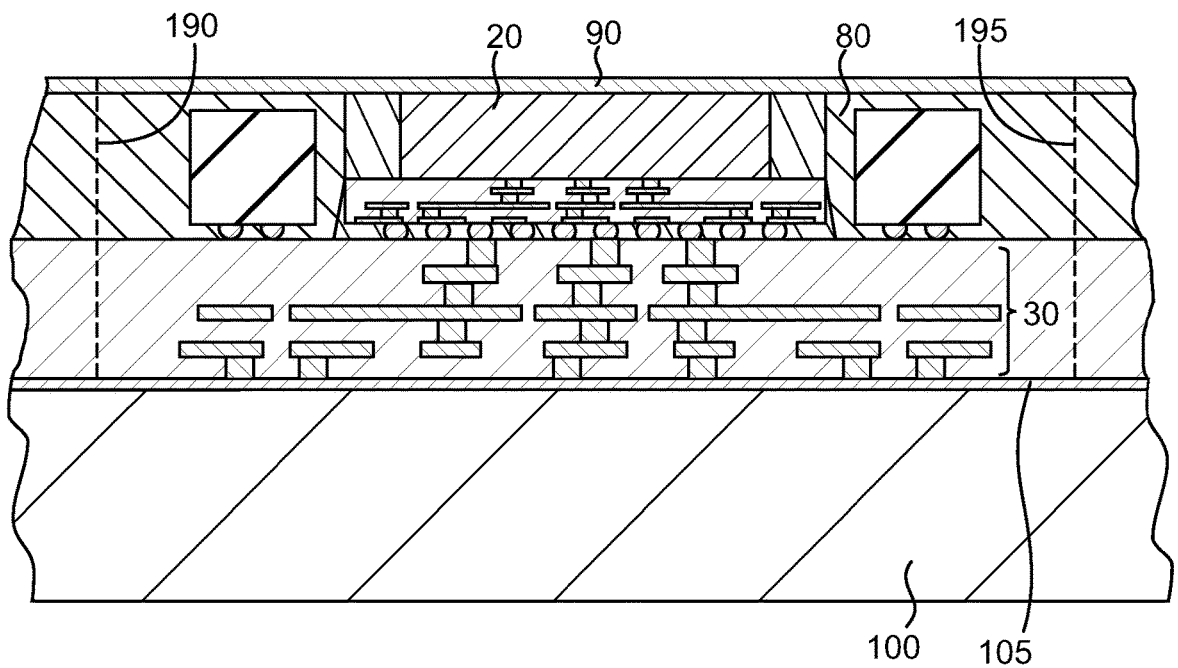
FIG. 18 is a sectional view like FIG. 17, but depicting exemplary stiffener sheet application.

Next and as shown in FIG. 17, the molding material 80 is compression molded on the otherwise exposed portions of the RDL structure 30 to surround the surface components 70 and 75 and at least laterally encase the combination of the chip 20, the molding material 30, the RDL structure 25 and the underfill 85. The molding material 80 can optionally also cover the upper surface 185 of the semiconductor chip 20 if desired. Grinding to expose the upper surface 185 can be done as needed. The molding materials and processes disclosed herein for the molding material 30 can be used for the molding material 80 as well. Next, and as shown in FIG. 18, the optional stiffener sheet 90 can be secured to the molding material 80 and the upper surface 180 of the semiconductor chip 20 if it is exposed. A suitable adhesive (not shown) can be dispensed on the molding material 80 and the chip 20 prior to the positioning of the stiffener sheet 90. Still referring to FIG. 18, following the molding operation to establish the molding material 80, the carrier wafer 100 is removed by grinding. The grinding operation also removes the seed layer 105 and exposes the lowermost metallization of the RDL structure 30. After removal of the carrier wafer 100, the RDL structure 30 makes up part of a reconstituted wafer. Indeed, there can be multitudes of RDL structures 30 and corresponding chips 20 thereon. At this point, the I/Os 65 can be placed on the RDL structure 25 and the combination of the chip 20, the RDL structure 25 and the molding 35 can be singulated at the dicing streets 190 and 195 shown in FIG. 18 to yield the singulated device 10 shown in FIG. 19. Optionally, the I/Os 60 could be placed after singulation. In either event, placement of the I/Os 65 can entail solder pick and place, solder stenciling, solder plating or other types of I/O connection/fabrication techniques. At this point, the semiconductor chip device 10 can in turn be mounted on another structure, such as the circuit board 15 depicted in FIG. 1.

Figure 19:
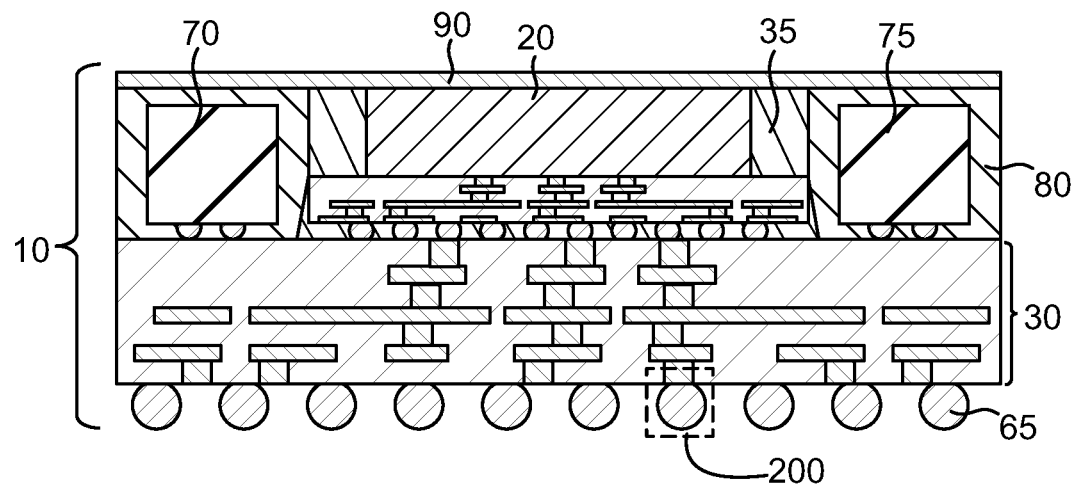
FIG. 19 is a sectional view like FIG. 18, but depicting exemplary singulation of the molded RDL structure.
Figure 20:
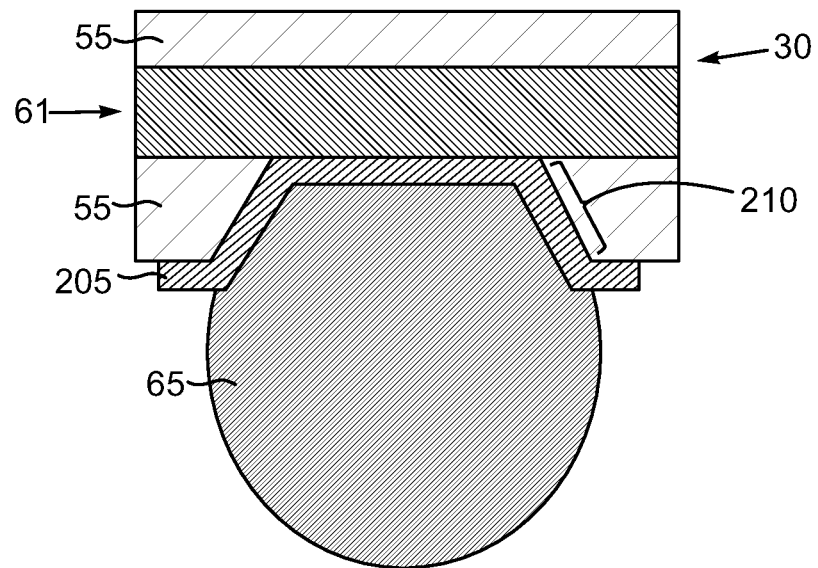
FIG. 20 is a blow up sectional view of an exemplary I/O.

Still referring to FIG. 19, the mounting of the I/Os 65 can be accompanied by or performed in conjunction with the fabrication of underbump metallization (UBM). Note the location of the small dashed rectangle 200 in FIG. 19. That rectangle 200 encompasses one of the I/Os 65. That portion is shown at greater magnification in FIG. 20. As shown in FIG. 20, a UBM structure 205 can be fabricated prior to attachment of the I/O 65. The UBM structure 205 can be deposited as a laminate of multiple layers such as TiN, copper, nickel, gold, vanadium or other UBM structure materials on the lowermost dielectric layer 55 of the RDL structure 30. Initially, an opening 210 is created in the lowermost dielectric layer 55, which can be the molded materials described above, or even another polymer, such as polyimide or benzocyclobutene, of the RDL structure 30 leading to the lower most metallization layer 61 of the RDL structure 30 using an etch back process. Subsequent to the deposition of multiple conductor layers for the UBM structure 205, a suitable lithographic process is performed to etch define the individual UBM structures 205. Thereafter, the I/Os 65 can be mounted to the UBM structure 205 and a reflow performed to establish the requisite metallurgical bonding.

Figure 21:
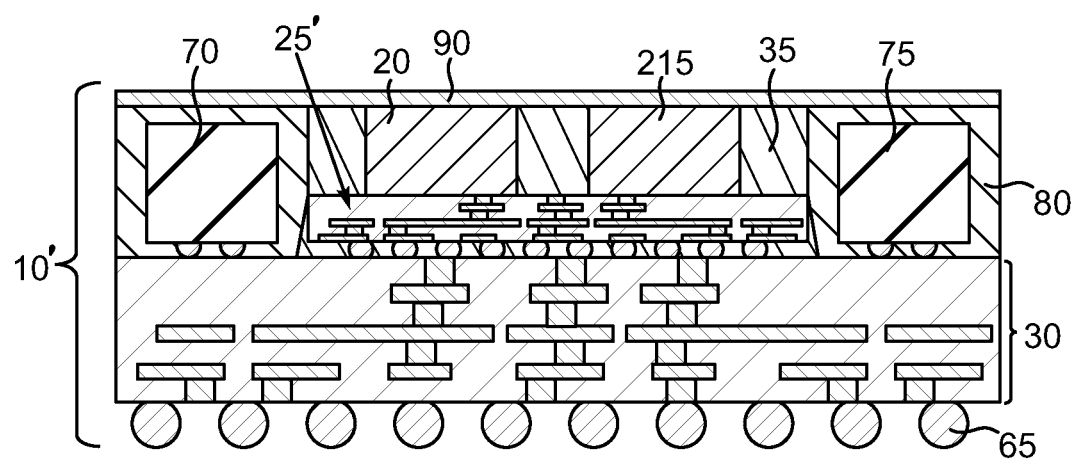
FIG. 21 is a sectional view like FIG. 19, but depicting an alternate exemplary semiconductor device.

In the foregoing illustrative arrangement, the semiconductor chip device 10 includes a single semiconductor chip 20 mounted on the RDL structure 25 and in turn the RDL structure 30. However, the skilled artisan will appreciate that multiple chips can be mounted on the RDL structure 25 and in turn the RDL structure 30. In this regard, FIG. 21 depicts a sectional view like FIG. 1 but of an alternate exemplary arrangement of the semiconductor chip device 10' that includes semiconductor chips 20 and 215 mounted in spaced-apart relation on a RDL structure 25', which can be substantially like the RDL structure 25, albeit with appropriate chip-to-chip electrical pathways in the RDL structure 25'. The RDL structure 25' can, in-turn, be mounted on the RDL structure 30. Other aspects of the semiconductor chip device 10' can be like the arrangement depicted above, such as the provision of the molding material 30, the I/Os 65, surface components 70 and 75, the molding material 80 and an optional stiffener sheet 90. Part of the RDL structure 25' can interconnect PHY regions (not visible) of the chips 20 and 165 and another part can provide ground/power connections.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    fabricating a first redistribution layer structure;
    fabricating a second redistribution layer structure;
    mounting the second redistribution layer structure on the first redistribution layer structure, the first redistribution layer structure and the second redistribution layer structure being separated by a gap;
    mounting a first semiconductor chip on the second redistribution layer structure and electrically connecting it to both the second redistribution layer structure and the first redistribution layer structure; and
    mounting plural surface components on the first redistribution layer structure in spaced-apart relation to the first semiconductor chip.

2. The method of claim 1, comprising electrically connecting the first semiconductor chip to the second redistribution layer structure with plural bumpless interconnects.

3. The method of claim 1, comprising placing an underfill between the second redistribution layer structure and the first redistribution layer structure.

4. The method of claim 1, comprising molding a first molding material to at least partially encase the first semiconductor chip.

5. The method of claim 1, comprising molding a second molding material to at least partially encase the plural surface components.

6. The method of claim 1, comprising mounting a second semiconductor chip on the second redistribution layer structure in spaced-apart relation to the first semiconductor chip, and electrically connecting the first semiconductor chip to the second semiconductor chip with the second redistribution layer structure.

7. The method of claim 1, comprising fabricating plural conductor structures of the first redistribution layer structure according to a first design rule and plural conductor structures of the second redistribution layer according to a second design rule with finer line width and spacing than the first design rule.

8. The method of claim 1, comprising fabricating the first redistribution layer structure as part of a first reconstituted wafer and the second redistribution layer structure as part of a second reconstituted wafer and thereafter singulating the first redistribution layer structure and the second redistribution layer structure.

9. A method of manufacturing, comprising:
    fabricating a first redistribution layer structure;
    fabricating a second redistribution layer structure;
    mounting the second redistribution layer structure on the first redistribution layer structure, the first redistribution layer structure and the second redistribution layer structure being separated by a gap;
    mounting a first semiconductor chip on the second redistribution layer structure and electrically connecting it to both the second redistribution layer structure and the first redistribution layer structure;
    molding a first molding material to at least partially encase the first semiconductor chip; and
    molding a second molding material to at least partially encase the plural surface components.

10. The method of claim 9, wherein the first molding material is molded prior to mounting the first semiconductor chip on the second redistribution layer structure.

11. The method of claim 9, comprising mounting a stiffener sheet on the second molding material.

12. The method of claim 9, comprising electrically connecting the first semiconductor chip to the second redistribution layer structure with plural bumpless interconnects.

13. The method of claim 9, comprising placing an underfill between the second redistribution layer structure and the first redistribution layer structure.

14. The method of claim 9, comprising mounting a second semiconductor chip on the second redistribution layer structure in spaced-apart relation to the first semiconductor chip, and electrically connecting the first semiconductor chip to the second semiconductor chip with the second redistribution layer structure.

15. The method of claim 9, comprising fabricating plural conductor structures of the first redistribution layer structure according to a first design rule and plural conductor structures of the second redistribution layer according to a second design rule with finer line width and spacing than the first design rule.

16. The method of claim 9, comprising fabricating the first redistribution layer structure as part of a first reconstituted wafer and the second redistribution layer structure as part of a second reconstituted wafer and thereafter singulating the first redistribution layer structure and the second redistribution layer structure.

17. A method of manufacturing, comprising:
fabricating a first redistribution layer structure with plural conductor structures according to a first design rule;
fabricating a second redistribution layer structure with plural conductor structures according to a second design rule with finer line width and spacing than the first design rule;
mounting the second redistribution layer structure on the first redistribution layer structure, the first redistribution layer structure and the second redistribution layer structure being separated by a gap; and
mounting a first semiconductor chip on the second redistribution layer structure and electrically connecting it to both the second redistribution layer structure and the first redistribution layer structure.

18. The method of claim 17, comprising mounting the first redistribution layer structure on a circuit board.

19. The method of claim 17, comprising fabricating the first redistribution layer structure as part of a first reconstituted wafer and the second redistribution layer structure as part of a second reconstituted wafer and thereafter singulating the first redistribution layer structure and the second redistribution layer structure.

20. The method of claim 17, comprising molding a first molding material to at least partially encase the first semiconductor chip and molding a second molding material to at least partially encase plural surface components positioned on the first redistribution layer structure.

* * * * *